United States Patent [19]
Levinson et al.

[11] Patent Number: 5,572,212
[45] Date of Patent: Nov. 5, 1996

[54] PIPELINED ANALOG TO DIGITAL CONVERTER

[75] Inventors: Roger A. Levinson; Sang T. Ngo, both of Sunnyvale, Calif.

[73] Assignee: Exar Corporation, San Jose, Calif.

[21] Appl. No.: 414,997

[22] Filed: Mar. 31, 1995

[51] Int. Cl.$^6$ .................................................. H03M 1/44
[52] U.S. Cl. ................................. 341/162; 341/172
[58] Field of Search .......................... 341/141, 155, 341/156, 161, 162, 172

[56] References Cited

U.S. PATENT DOCUMENTS

| | | | |
|---|---|---|---|
| 4,306,224 | 12/1981 | Geller et al. | 340/347 |
| 4,507,121 | 2/1986 | Carbrey | 340/347 |
| 4,760,376 | 7/1988 | Kobayashi et al. | 340/347 |
| 4,894,657 | 2/1990 | Hwang et al. | 341/158 |
| 5,212,486 | 5/1993 | Nagaraj | 341/172 |
| 5,298,814 | 3/1994 | Caruso | 307/529 |
| 5,321,402 | 6/1994 | Matsuzawa et al. | 341/161 |
| 5,394,148 | 2/1995 | Matsuura et al. | 341/162 |
| 5,402,128 | 3/1995 | Kusumoto et al. | 341/172 |

FOREIGN PATENT DOCUMENTS

| | | | |
|---|---|---|---|
| 403278717 | 12/1991 | Japan | 341/161 |
| 404003520 | 1/1992 | Japan | 341/161 |

*Primary Examiner*—Jeffrey A. Gaffin
*Assistant Examiner*—J. H. Vick
*Attorney, Agent, or Firm*—Townsend and Townsend Khourie and Crew; Henry K. Woodward

[57] ABSTRACT

A pipelined analog to digital converter in which data samples ripple down through the pipeline of comparator stages. Each stage of the pipeline includes switch capacitor amplifiers for comparing an analog signal to a first reference voltage, to a second reference voltage, and to an average of the first and second reference voltages. Fan out of circuit components can be eliminated in succeeding stages, and error correction is provided by including overlapping of ranges passed by an earlier stage to a subsequent stage.

10 Claims, 7 Drawing Sheets

PIPELINED ANALOG TO DIGITAL CONVERTER

BACKGROUND OF THE INVENTION

This invention relates generally to analog to digital converters (ADC), and more particularly the invention relates to a pipelined ADC.

A number of different converters have been developed for the conversion of analog signals to digital signals. These include many types, such as the integrating ADC which is highly accurate but slow (1–10 kHz), the successive approximation which is medium speed (less than 500 kHz) with medium resolution, the flash ADC which is very high speed (greater than 1 mHz) but with low to medium resolution, and the pipeline ADC which is highly accurate with medium to high speed (greater than 1 mHz).

The integrating ADC uses a digital to analog converter (DAC) to obtain the ADC function. In the most basic form, this scheme uses a digital counter, a DAC, and a comparator to obtain the ADC function. The counter is set to start counting up from zero by an external signal, and the digital outputs are fed to the DAC which produces an analog output voltage in accordance with a counter digital count. At each count step, the DAC output voltage is compared with the input analog signal and, when the DAC output voltage is equal to or higher than the analog input, the counter is stopped. The count and the stop counter represents the magnitude of the analog input signal.

The successive approximation ADC makes an intelligent decision to quickly locate the signal prior to modifying a counter. It obtains its enhancements in first determining which half (above or below half scale) a signal is in prior to changing the counter. For example, starting with the most significant bit set results in the following logic. If the comparator trips, the signal is in the lower half. If the comparator does not trip, the signal is in the upper half. This usually reduces the time to locate the actual level of this signal.

The flash ADC is a technique which is widely used at present. Measurement is straight forward and nearly instantaneous without the time consuming counter as used in the earlier ADCs. A series resistor divider network provides references to a number of analog comparators. There are as many taps in the divider network and comparators as bits of resolution. Each tap provides a stable step reference voltage to its associated comparator.

Traditional flash architectures have been upgraded using interpolating techniques. As disclosed in U.S. Pat. No. 5,298,814, analog to digital converters combine the concepts of residue amplification and averaging to simplify the circuit implementation of high order, high speed analog to digital converters. The circuitry uses active transconductor devices, for example a pair of CMOS inverters having a common drain as an output, a first input connected to the gates of one inverter, a second input connected to the gates of the other inverter, and with the inverters operating in a linear gain range. Such active analog averaging circuits can be employed in an analog to digital converter employing residue amplification to provide an improved high order, high speed device.

A standard pipeline approach uses a sample and hold, one bit DAC, a subtractor, and a multiplier (×2). An analog sample is first frozen in time by the sample and hold circuit to allow the processing of that sample by subsequent circuits. At the output of the sample and hold, a summing circuit subtracts a voltage reference from the sample. The reference voltage is designed to be one-half of the analog full scale input range which allows the circuit to function simply on whether the sample is above or below the reference, that is, in the upper or lower half of the input range.

The present invention is directed to a pipelined ADC having an increased operating speed which utilizes the basic active interpolating technique applied in a pipeline architecture.

SUMMARY OF THE INVENTION

The analog to digital converter in accordance with the present invention utilizes active interpolation in a pipeline architecture to realize improved speed and resolution at much lower cost over conventional ADCs. The pipeline approach using interpolating techniques provides reduced component count for higher resolution by eliminating component fan out as higher resolution flash and interpolating ADCs.

In accordance with a feature of the invention, the residue result at each stage is gained up for evaluation at the next stage. In the gaining up process, the reference voltage minus analog input signal (Vref–Ain) is passed to the following stage along with a common mode reference voltage (Vref). Both of these components are passed through the same amplifier so both components are gained up equally, and the information passed has an exact replication of the original signal and reference voltage. The exact gain from stage to stage is unimportant thereby allowing easier manufacturing and error control.

Advantages of the invention include elimination of component fan out associated with some other interpolating techniques. Each stage requires an equal number of components to implement the subject patent pipeline. Final stages may revert to other techniques for error correction. Also, stage-to-stage gain is not critical for determining accuracy. Offset errors are reduced by a unique mux interconnect technique. Error correction for DNL errors falls out of the technique naturally, without adding complex circuitry. The ADC is independent of a requirement of having to deal with a large number of comparator delays and settling time which is the case for a flash converter. There is a reduction in signal delays, power consumption and complexity. The pipeline ADC provides for high resolution, increased sensitivity, at lower component count and cost.

The invention and objects and features thereof will be more readily apparent from the following detailed description and appended claims when taken with the drawings.

DETAILED DESCRIPTION OF ILLUSTRATIVE EMBODIMENTS

Figure 1:
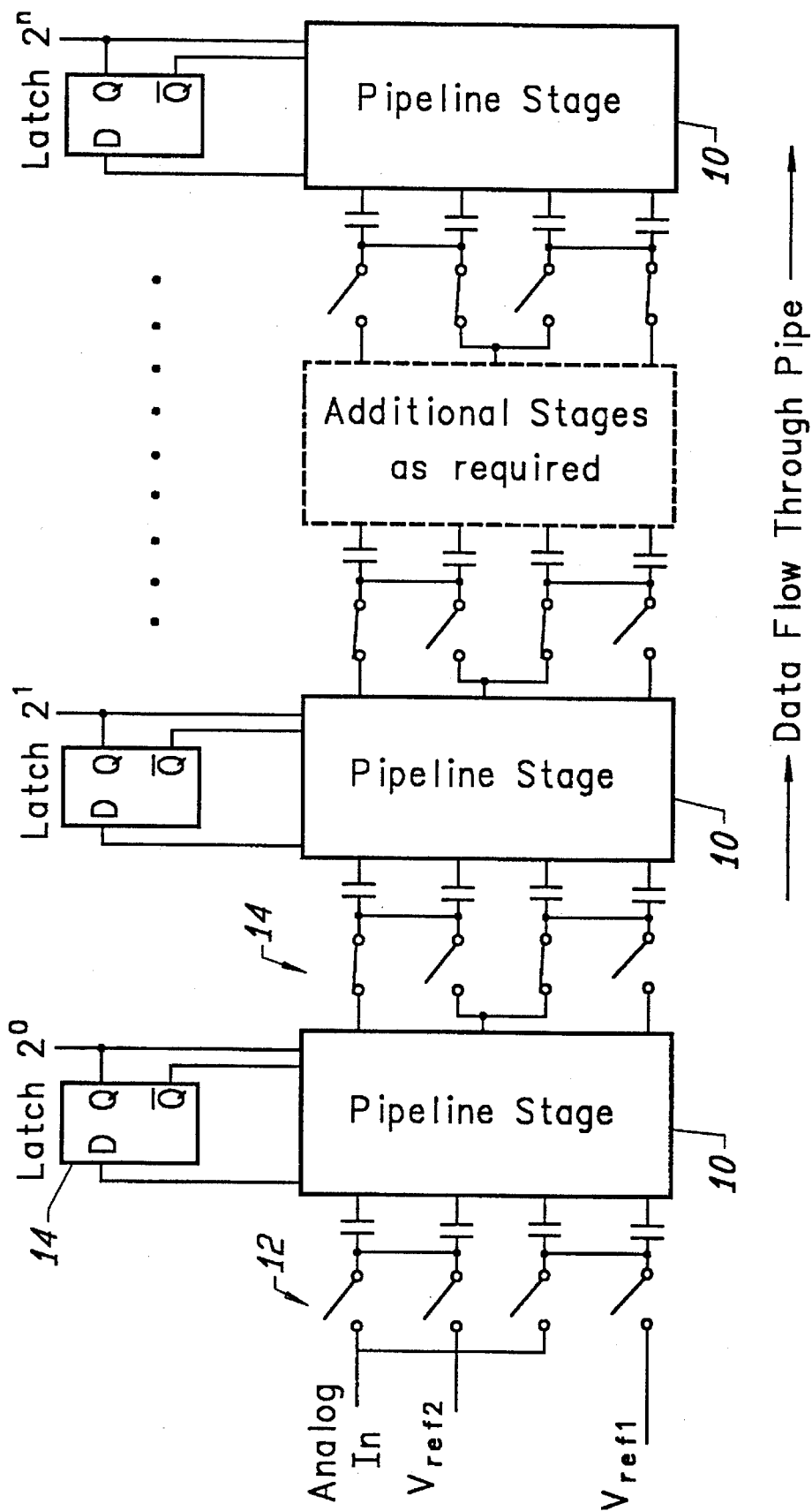
FIG. 1 is a diagram of a pipelined ADC in accordance with the present invention.

Referring now to the drawing, FIG. 1 illustrates the architecture of an ADC in accordance with the invention in which analog to digital samples rippled down through the pipelined converter including successive stages 10. In the first stage, an analog input signal (Ain) and two reference voltages (Vref1, Vref2) are applied to capacitive inputs through sampling switches 12, a first bit of the analog to digital conversion ($2^0$) is latched at 14 and the output signals of amplifiers are then applied through a multiplexer 14 to the second pipeline stage. The rippling of the analog samples through the pipeline converter allows parallel sampling of new data while still processing older data further down the pipe.

Figure 2:
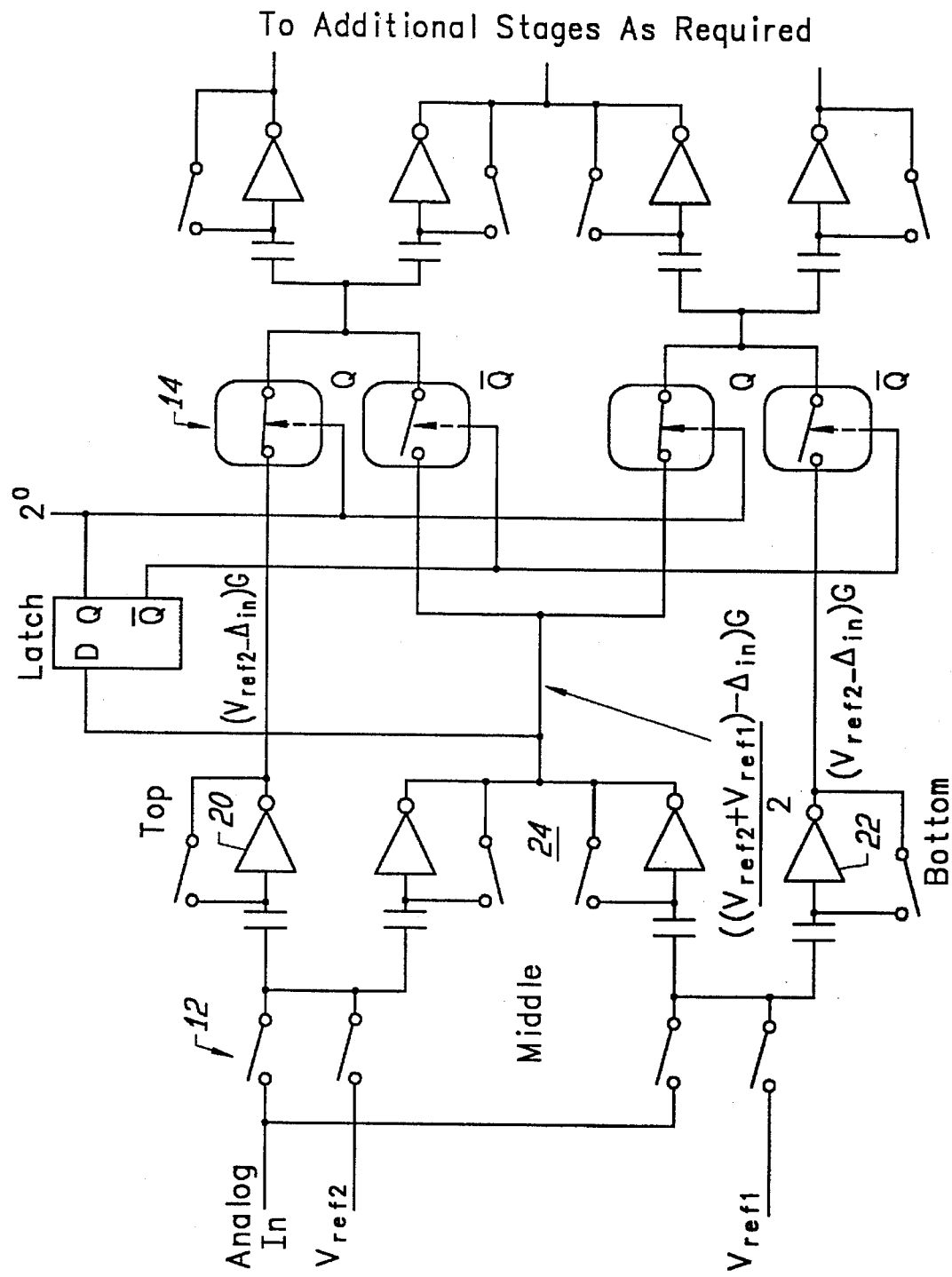
FIG. 2 is a schematic of the input stage in the pipeline architecture of FIG. 1.
Figure 4:
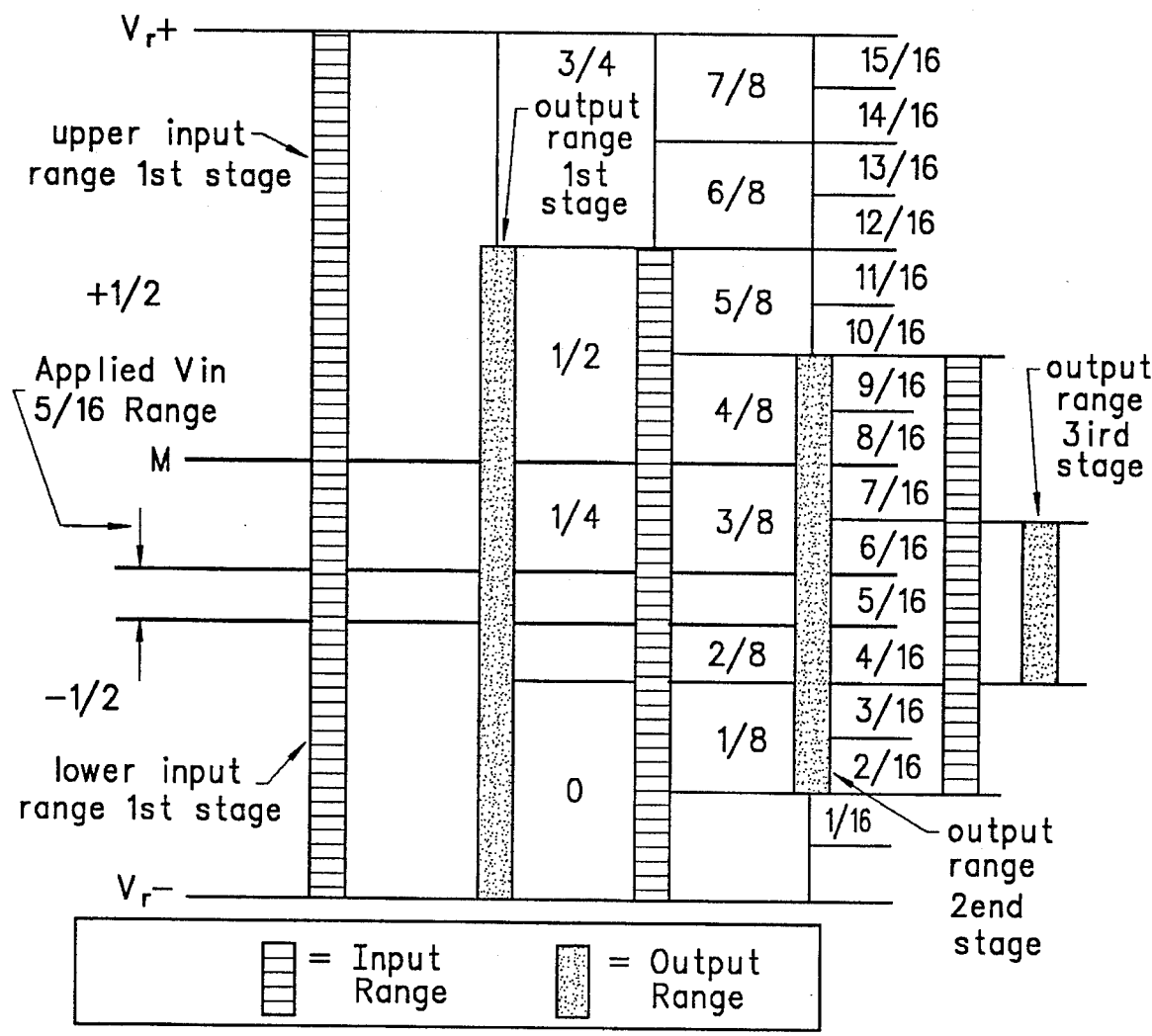
FIG. 4 illustrates error control through overlapping ranges employed in the ADC in accordance with the invention.

FIG. 2 is a schematic of one pipeline stage 10 in the architecture of FIG. 1. The first stage consists of top/bottom amplifier elements 20, 22 and a middle reference generation circuit 24. The approach is similar to the switch capacitor comparator technique known in the art. The technique takes advantage of the decision process at each level (stage) which carries the analog signal and reference values. The middle element 24 provides output from the two supplied references [(Vref1+Vref2)÷2−Ain],G. One reference can equal a full scale (FS) range, while the other reference can be a bottom range. The first stage makes a decision whether the analog input is above or below the middle reference and sets a latch accordingly. The latch sets to a logic one if the signal is above the middle reference or to a logic zero if the input is equal or below the middle reference. A following stage then receives its input through the switch network 14. The switching arrangement is connected according to the logic state of the previous latch. If the signal were in the upper half (latch set to a logic one), the top signal component is routed to a following amplifier arrangement. If the signal is in the lower half (latch set to zero), the lower signal component ((Vref1−Ain) * Gain) is routed to the following amplifier stage. Each successive stage narrows down the remaining signal range. For example, if the signal were in the upper half, the next stage would make a decision on whether the signal is above or below three quarter scale. In actuality, each stage's range is made to extend beyond the selected range to provide error correction, as will be described further with reference to FIG. 4.

Figure 3B:
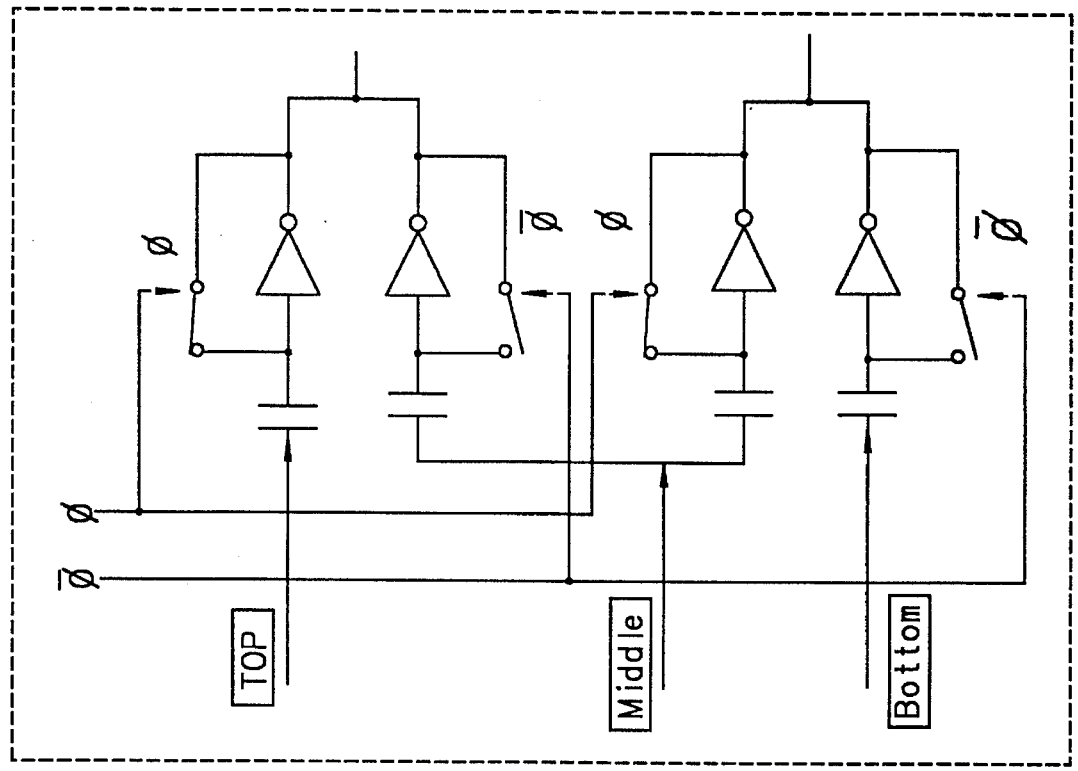
FIGS. 3A, 3B illustrate the input mux and output mux in FIG. 2.
Figure 3A:
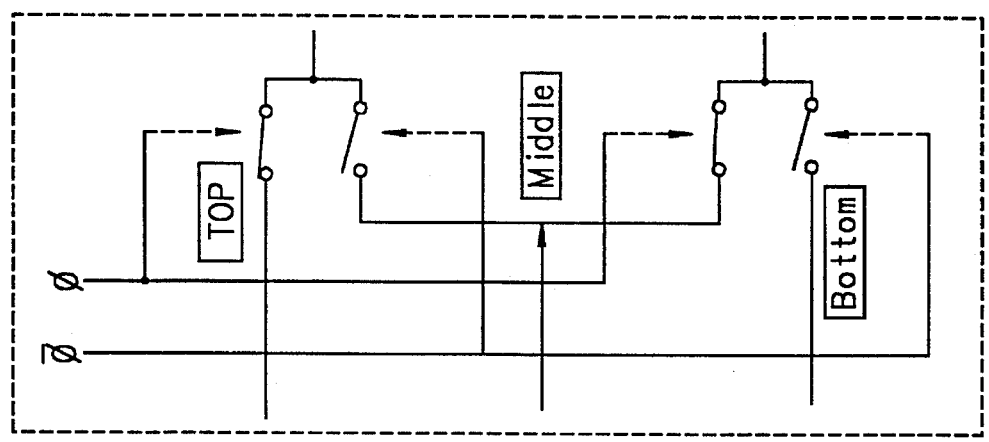

FIGS. 3A, 3B illustrate the switching arrangements of the input multiplexer (3A) and the output multiplexer (3B). The arrangement in FIG. 3 is a 2:1 mux, but other mux combinations could be used, for example a 4:1 mux with parallel expansion of the circuitry of the stage. This would effectively double the resolution of each pipeline stage in a parallel fashion allowing two bits of information per stage. The switches in the multiplexers of FIGS. 3A, 3B are driven by Ø and $\overline{Ø}$ clock signals which allows high output impedance, transconductance amplifiers to be operated in pairs with both switches closed in the offset mode. Individual amplifiers connected as pairs will exhibit their own unique offset. In this configuration the offset will be the average of the two offsets. As such, the offset is constant and the Δ between the offset and the signal will be the same regardless of which inverter is selected by the Ø or $\overline{Ø}$ drive state. The switching arrangement is considerably easier to implement with present day semiconductor manufacturing processes while maintaining excellent error margins.

In the actual implementation of the ADC, various stages can exhibit output differences that are the result of variations of a manufacturing process, with the differences showing up as errors for the correct digitization of a given analog input voltage. If the existence of an error in an early stage cannot be corrected in a following stage, the digitized output will be incorrect. To overcome this limitation, the invention includes overlapping of ranges passed by an earlier stage to a subsequent stage. This overlapping can be seen in FIG. 4 where an analog input is applied in the 5/16 input range. The first stage makes a decision as to whether the analog signal is above M or below M and passes information for zero and one-fourth range, as the signal is in the lower half. Additionally, signal information for the one-half range is also passed to the second stage as overlap information. Hence, the second stage has signal information for three-fourths of the original input signal. The second stage passes the 2/8 and 3/8 range information as would be expected without an overlap as well as the 1/8 and 4/8 information range for the overlap requirement. The zero and 5/8 range are, however, eliminated at this point. Repeating this process in a third stage reduces the range down to 4/16, 5/16 for the expected range, 3/16 and 6/16 for the overlap ranges. If this process were to continue to the last stage, the overlap information carried to the final stage would be reduced to ±½LSB which will usually be less than the maximum possible error. For this reason, one must limit the number of pipeline stages in each ADC segment (section) so that the maximum possible error range will not be lost. The error correction stage can be a fully interpolated flash ADC at the end of the last segment or an intermediate error correction stage which identifies and corrects errors from previous stages. These error correcting stages utilize the information in the overlap and underlap regions to determine and correct errors introduced by previous stages.

Figure 5:
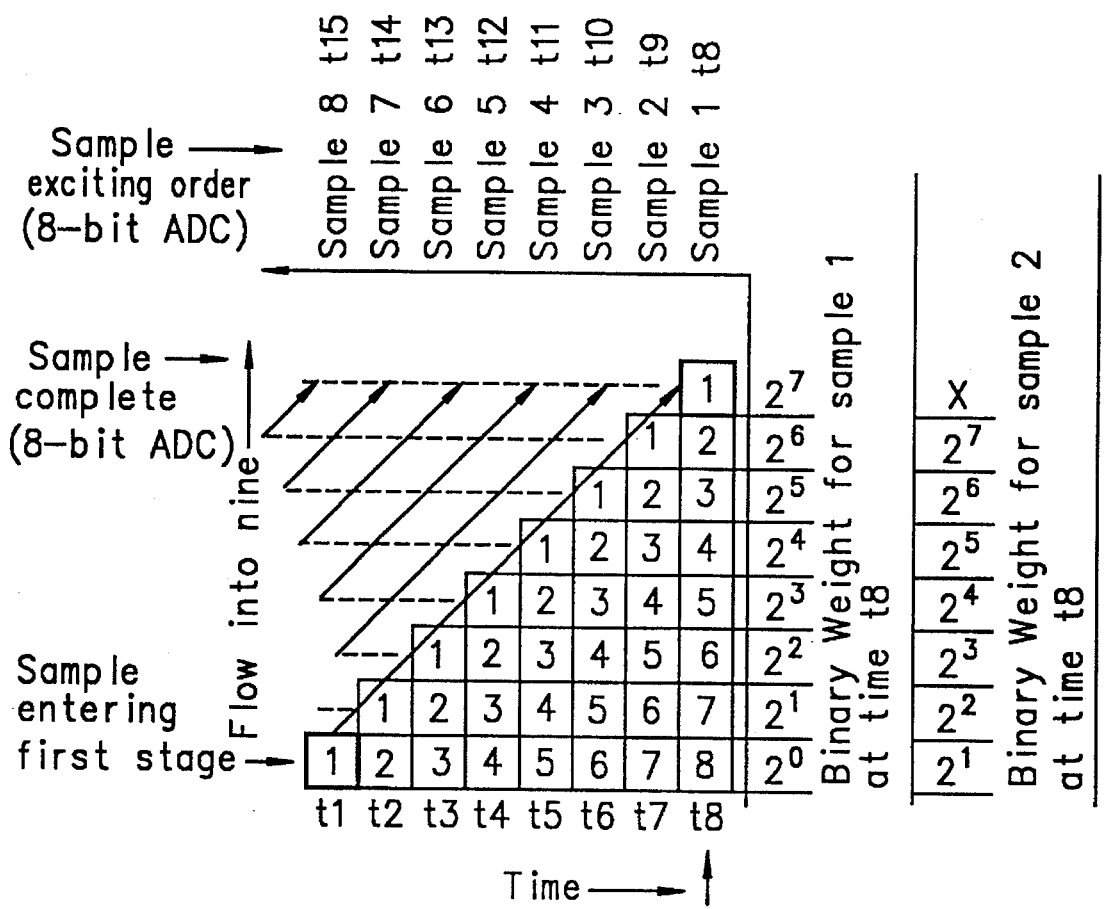
FIG. 5 illustrates the delayed events in the pipeline architecture of the invention.

FIG. 5 illustrates conceptually the delayed events in an 8 bit pipeline ADC. Samples ripple down the pipeline arriving at the final stage, a number of switch cycles equal to the number of stages in the pipe. It can be seen that the first data does not exit the pipe until time T8. It can be further seen that at time T8, sample number 2 is missing the LSB, and the data is shifted down in the pipe by one cycle. This illustration assumes that each pipeline stage converts one bit of information per clock cycle.

Figures 6A, 6B:
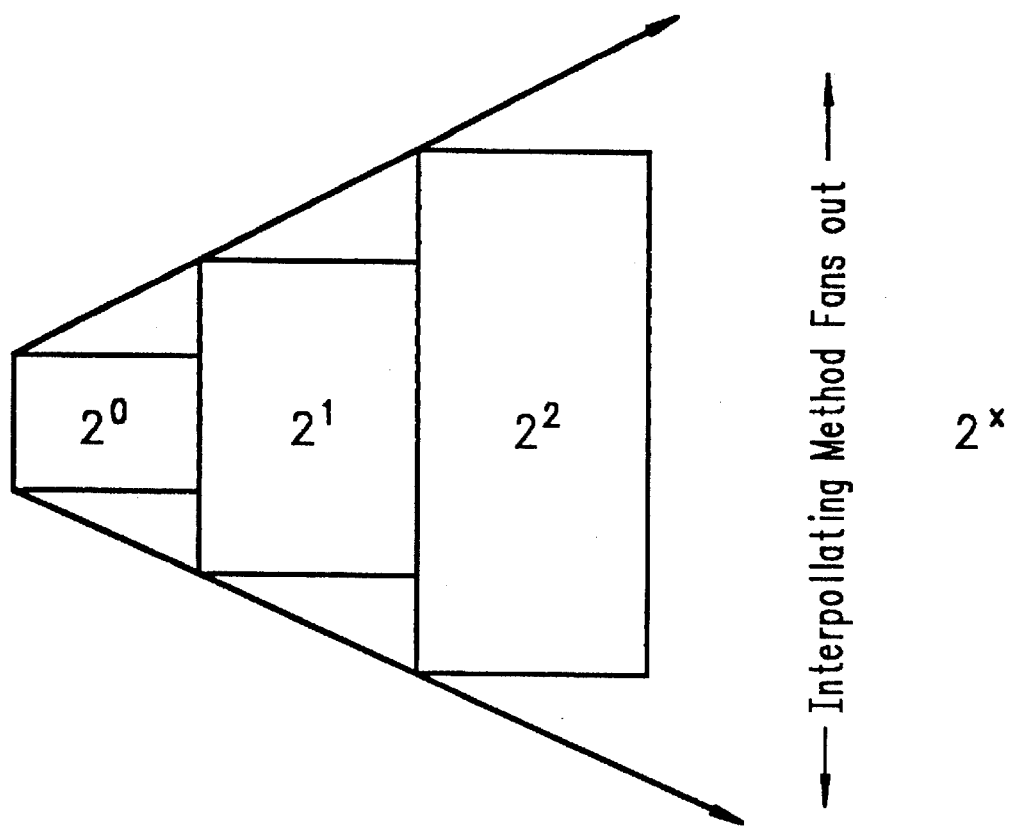
FIG. 6A, 6B illustrate the component fan out in a conventional interpolating technique and the elimination of fan out in the invention, respectively.

FIGS. 6A, 6B illustrate the fan out of component circuitry in the conventional interpolating method (6A) and the lack of fan out in the pipeline of the present invention (6B). The conventional interpolating ADC tends to grow geometrically to the resolution (number of stages required). However, in the pipeline interpolating approach of the invention, the growth in component requirements does not expand from one stage to the next. The parallel sampling technique provides for increased throughput (processing speed), and the large number of components required in higher order stages of interpolating pipeline designs is reduced since each stage has an equal count.

Figure 7:
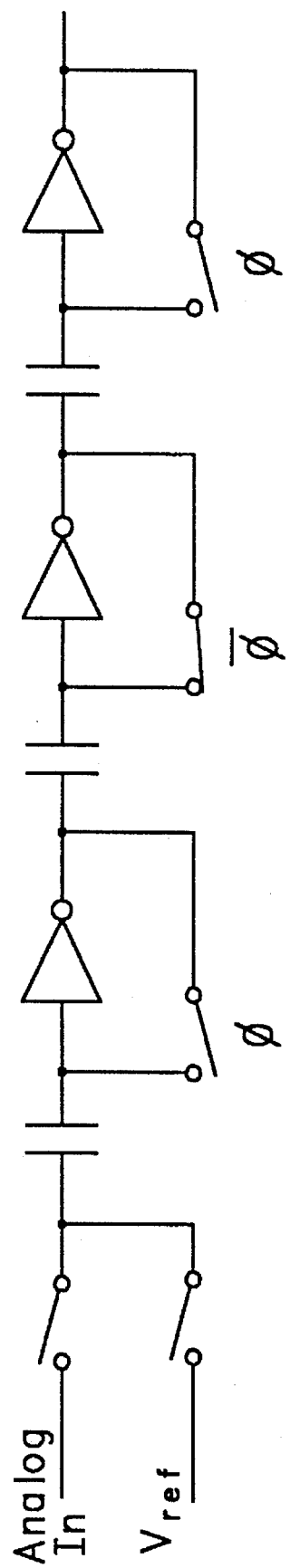
FIG. 7 illustrates pipeline to analog conversion in the ADC of the invention.

A simplified block diagram for the basic amplifier structure of a pipeline ADC using interpolation in accordance with the invention is shown in FIG. 7. The stages are alternately switched in and out of the track/hold and amplify modes. With a balance switch closed, the circuit acts as a track and hold. Alternatively, when the balance switch is open, the circuit acts as an amplifier. Thus, a previous stage is in the track and hold mode while the following stage is in the amplify mode, and vice versa. For example, when a previous stage is in a track and hold mode, reference is being set up within the two stages. When the previous stage is in the amplify mode, a difference between the original reference and the analog input is being generated. This is very similar to the track/hold and amplify modes of a switched capacitor amplifier.

Looking down the pipe of an ADC with the switch of the first stage (MSB) opened, the first stage is providing a difference to a previous reference compared to an analog input signal. The next stage is providing a reference to a third stage (moving left to right in FIG. 7). In the next switch cycle, the difference between the reference previously passed to the third stage, and the analog value at the output of the second stage, will be passed to the fourth stage. At the same time, the first stage will be processing a new sample.

There has been described an analog to digital converter having increased operating speed in which interstage switching is employed in a pipeline interpolation scheme to reduce the number of components required and eliminate stage fan out for medium to high resolution ADCs. Error correction is built in by providing overlap between stages. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A pipelined analog to digital converter comprising
a plurality of pipelined analog comparator stages including a first stage,
means for providing to said first stage an analog input signal (Ain), a first reference voltage (Vref1), and a second reference voltage (Vref2),
said first stage having a first amplifier for providing an amplified comparison of said analog input signal and said first reference voltage ((Vref1−Ain) G), a second amplifier for providing an amplified comparison of said analog input signal and said second reference voltage, a middle reference generation circuit and amplifier for providing an amplified comparison of said analog input signal and an average of said first reference voltage and said second reference voltage $$\left( \left[ \frac{Vref2 + Vref1}{2} - Ain \right] G \right)$$

and latch means for storing a digital bit indicative of the amplified comparison of said analog input signal and said average, and multiplex means for transferring outputs of said amplifiers to a second stage.

2. The analog to digital converter as defined by claim 1 wherein each amplifier comprises a switched capacitor amplifier.

3. The analog to digital converter as defined by claim 2 wherein said multiplex means transfers outputs from said first stage as inputs to amplifiers in said second stage.

4. The analog to digital converter as defined by claim 3 wherein all amplifiers in said first stage have the same amplification factor.

5. The analog to digital converter as defined by claim 4 wherein all of said stages have the same number of inputs and outputs without fan out of components in succeeding stages.

6. The analog to digital converter as defined by claim 1 wherein all amplifiers in said first stage have the same amplification factor.

7. The analog to digital converter as defined by claim 6 wherein all of said stages have the same number of inputs and outputs without fan out of components in succeeding stages.

8. The analog to digital converter as defined by claim 1 wherein each succeeding stage receives a range from the preceding stage including an expected signal range and additional error correcting ranges.

9. The analog to digital converter as defined by claim 8 wherein a final stage includes a parallel conversion.

10. The analog to digital converter as defined by claim 8 wherein an intermediate stage includes error correction.

* * * * *